United States Patent [19]
Subramanian et al.

[11] Patent Number: 5,824,579
[45] Date of Patent: Oct. 20, 1998

[54] METHOD OF FORMING SHARED CONTACT STRUCTURE

[75] Inventors: Chitra K. Subramanian; James D. Hayden, both of Austin, Tex.

[73] Assignee: Motorola, Inc., Schaumburg, Ill.

[21] Appl. No.: 632,207

[22] Filed: Apr. 15, 1996

[51] Int. Cl.[6] .............................................. H01L 21/8244
[52] U.S. Cl. .......................... 438/238; 438/597; 438/637; 148/DIG. 20
[58] Field of Search ..................................... 438/238, 241, 438/597, 637; 257/903–904; 148/DIG. 20

[56] References Cited

U.S. PATENT DOCUMENTS

| | | | |
|---|---|---|---|
| 4,322,736 | 3/1982 | Sasaki et al. | 357/59 |
| 4,908,688 | 3/1990 | Lund et al. | 357/41 |
| 4,966,864 | 10/1990 | Pfiester | 437/191 |
| 4,977,105 | 12/1990 | Okamoto et al. | 437/190 |
| 5,296,729 | 3/1994 | Yamanaka et al. | 257/377 |
| 5,373,170 | 12/1994 | Pfiester et al. | 257/69 |
| 5,459,688 | 10/1995 | Pfiester et al. | |
| 5,514,880 | 5/1996 | Nishimura et al. | 257/70 |
| 5,589,415 | 12/1996 | Blanchard. | |

OTHER PUBLICATIONS

Faggin, et al.; "A Faster Generation of MOS Devices With Low Thresholds Is Riding The Crest Of The New Wave, Silicon–Gate IC's;" Electronics; pp. 88–94 (1969).

*Primary Examiner*—Jey Tsai
*Attorney, Agent, or Firm*—George R. Meyer

[57] ABSTRACT

A shared contact structure (30) is formed to electrically connect three coupling layers (59,60,46) to each other and to an active region (33) in a semiconductor substrate (31). A first coupling layer (59) and a second coupling layer (60) are formed such that they are physically isolated from each other. The second coupling layer (60) is formed such that it is in physical contact with the active region (33). A contact opening (45) is formed, which exposes a portion of coupling layers (59, 60). The third coupling layer (46) is then formed so that it is in electrical contact with the second coupling layer (60) and the first coupling layer (59).

9 Claims, 2 Drawing Sheets

METHOD OF FORMING SHARED CONTACT STRUCTURE

BACKGROUND OF THE INVENTION

This invention relates, in general, to semiconductor devices, and more particularly, to methods of forming shared contact structures in semiconductor devices.

In semiconductor manufacturing, the pace of technological advancements requires that the cost of new semiconductor devices be reduced. Yet at the same time, the performance of the semiconductor device must be improved. To reduce the cost of semiconductor devices, the device geometries are generally reduced to increase the number of devices that are made with each manufacturing lot. To increase the performance or functionality of semiconductor devices generally requires that additional layers of interconnect be used to provide the necessary internal connections. However, the more coupling layers that are used to provide the internal connections, the more complicated are the requirements for forming contacts between the coupling layers. In many processes, as the thickness or number of coupling layers increases, the size of the contact that must be formed also increases to adjust for problems associated with forming the contact opening. Therefore, there is a conflict between reducing the size of semiconductor devices to reduce cost, and increasing the size of contacts to improve the functionality of the device.

For example, many high density memory devices, such as static random access memories (SRAMs), use up to five layers of polysilicon and three layers of metal interconnect to achieve the desired functionality. Typically, there is a layer of dielectric material between each of the coupling layers to provide both physical and electrical isolation. In some cases it is necessary for three or more of the layers of polysilicon to be electrically tied together and coupled to the underlying semiconductor substrate. To ensure that a reliable electrical contact is formed through the many interlevel dielectric layers, these contacts can be quite large and can consume a relatively large portion of the space of each memory cell in the SRAM device. The formation of such contacts is complicated by the need to physically isolate the electrical contact from neighboring conductive structures. The formation of these contact structures is further complicated by thickness of the intermediate dielectric and coupling layers.

By now it should be appreciated that it would be advantageous to provide a method of fabricating a contact structure that reduces the overall size of a semiconductor device. It would also be advantageous if the method could be formed with fewer processing steps than previously known contact structures so that the processing complexity and manufacturing cost of the semiconductor device are improved.

DETAILED DESCRIPTION OF THE DRAWINGS

The present invention is directed to a shared contact structure in a semiconductor device. The shared contact structure electrically connects three coupling layers together, and the shared contact structure is electrically coupled to an active region in a semiconductor substrate. As used in this specification, an active region is a region within the substrate in which current is designed to flow during the operation of the device. Examples of active regions include source regions, drain regions, and source/drain regions. One feature of the present invention is that two of the coupling layers are physically separated from each other, but are in electrical contact due to the shared contact structure. Both the configuration and method of forming the shared contact structure of the present invention will help reduce the manufacturing cost of a semiconductor device employing the shared contact structure.

Figure 1:
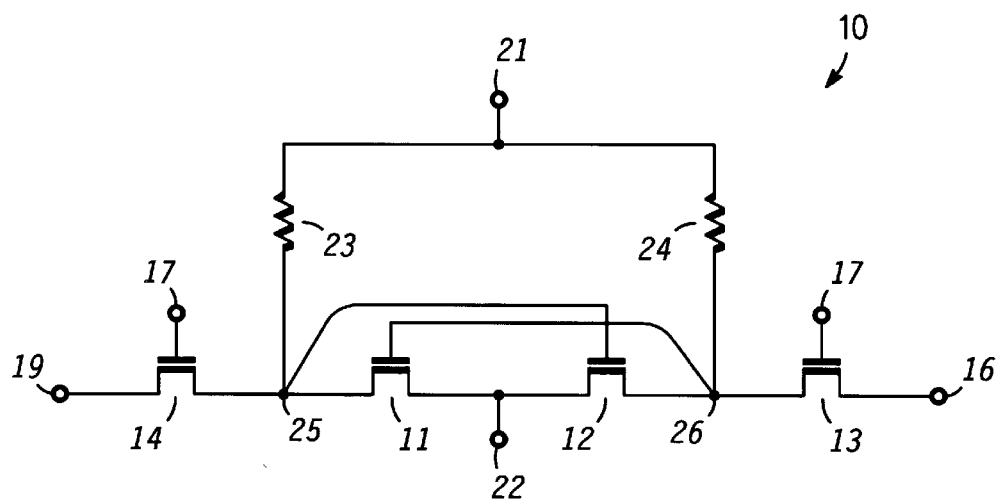
FIG. 1 is a schematic of an SRAM cell (prior art)

FIG. 1 is a schematic of a static random access memory (SRAM) cell 10. SRAM cell 10 comprises latch transistors 11 and 12 that are used in conjunction with load resistors 23 and 24 to store a logic value. Select transistors 13 and 14 are used to access the value stored in SRAM cell 10 by placing control voltages on terminals 16, 17, and 19, and connecting terminal 21 to a power supply and terminal 22 to ground. Terminal 17 represents the word line signal, which is used to enable select transistors 13 and 14. Terminals 16 and 19 represent the bit line and bit line bar connections common to most SRAM cells.

To make the SRAM cell 10 in accordance with an embodiment of the present invention, coupling layers and contacts are used to provide the necessary internal connections. In particular, storage nodes 25 and 26 represent the locations where the shared contact structure of the present invention is used. For examples storage node 26 is the node where load resistor 24 contacts the source/drain of select transistor 13, the drain of latch transistor 12, and the gate of latch transistor 11. It is quite common in advanced SRAM devices that the first two coupling layers include polysilicon and are used to form the gate structures of transistors 11 and 12 and provide electrical connections between components within the SRAM cell. Load resistor 24 is typically formed in a third layer of doped polysilicon that is configured to provide the desired resistance value.

Although two coupling layers are electrically connected to each other within SRAM cell 10, in other portions of the device (not shown), the two coupling layers are not to be electrically connected to each other. Therefore, care must be taken to physically isolate (separate) the first coupling layer of polysilicon from the second coupling layer of polysilicon. The shared contact structure of the present invention not only provides the desired electrical contact between the coupling layers, but it is formed in such a manner that the space consumed by the shared contact is minimized and can be formed in fewer steps than some previously known contact structures.

Figure 2:
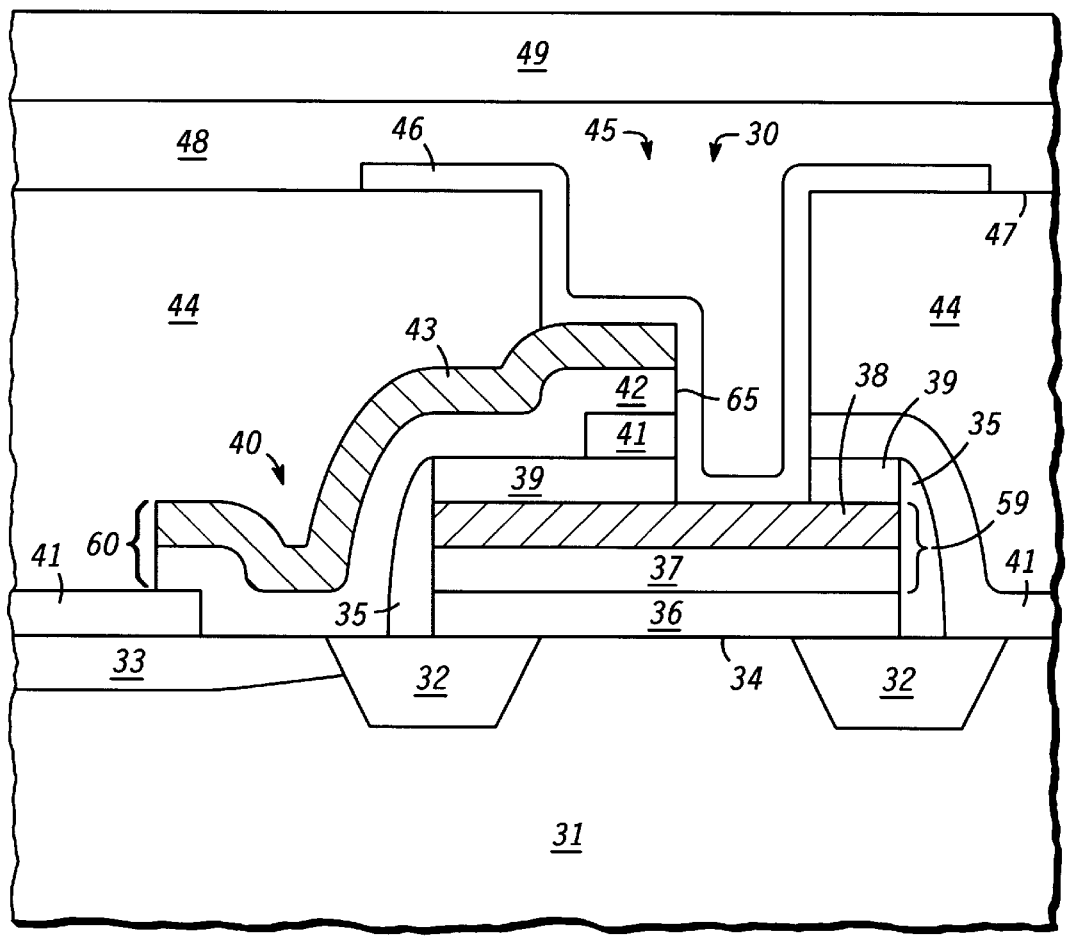
FIG. 2 is an enlarged cross-sectional view showing the shared contact according to a first embodiment of the present invention.

Referring now to FIG. 2, a more detailed description of a shared contact structure 30 will be provided. FIG. 2 is an enlarged cross-sectional view of shared contact structure 30 as it might be used in a semiconductor device, such as SRAM cell 10 of FIG. 1. Shared contact structure 30 comprises a first coupling layer 59, a second coupling layer 60, and a third coupling layer 46. As shown in FIG. 2, first coupling layer 59 comprises a first polysilicon layer 37 and a first conductive layer 38. First conductive layer 38 can be made from a variety of materials (typically refractory metal-containing materials) and is optionally formed on first polysilicon layer 37 to form first coupling layer 59. First conductive layer 38 is used to lower the resistance of the first coupling layer 59. In the following narration, the combination of first conductive layer 38 and first polysilicon layer 37 are referred to as first coupling layer 59. It should also be understood that first coupling layer 59 could consist of a single layer of conductive material, such as polysilicon, or comprise a plurality of conductive layers.

Second coupling layer 60 comprises a second polysilicon layer 42 and a second conductive layer 43. Second conductive layer 43 can be made from a variety of materials and is optionally formed on second polysilicon layer 42 to form second coupling layer 60. Second conductive layer 43 is used to lower the resistance of the second coupling layer 60. In the following narration, the combination of second conductive layer 43 and second polysilicon layer 42 are referred to as second coupling layer 60. It should also be understood that second coupling layer 60 could consist of a single layer of conductive material, such as polysilicon, or comprise a plurality of conductive layers.

As shown in FIG. 2, third coupling layer 46 is a single layer of conductive material, such as polysilicon. It should also be understood that third coupling layer 46 can be formed from a variety of conductive materials and can comprise a plurality of conductive layers. Although not shown in FIG. 2, portions of the third coupling layer 46 can include resistive sections that could be resistors 23 or 24 of the SRAM cell 10. The portion of coupling layer 46 shown in FIG. 2 is conductive. Coupling layer 46 does not physically contact the semiconductor substrate 31.

The configuration of shared contact structure 30 provides an electrical connection from third coupling layer 46 to both second coupling layer 60 and first coupling layer 59. As shown in FIG. 2, third coupling layer 46 is in physical contact with second coupling layer 60 and first coupling layer 59. Therefore, coupling layers 59, 60, and the portion of third coupling layer 46 shown in FIG. 2 are at an essentially equal voltage potential. In addition, any conductive layers in physical or electrical contact with coupling layers 59, 60, and the portion of third coupling layer 46 shown in FIG. 2 would be at an essentially equal voltage potential.

Referring to storage node 26 in the SRAM cell 10 of FIG. 1, third coupling layer 46 of FIG. 2 is the layer of polysilicon used to construct load resistor 24. Second coupling layer 60 provides the electrical connection from load resistor 24 to the source region of transistor 12 and the source/drain region of transistor 13. This electrical connection is shown in FIG. 2 as the area where second coupling layer 60 contacts an active region 33. As shown in FIG. 1, the gate structure of latch transistor 11 is electrically connected to storage node 26. This electrical connection is shown in FIG. 2 as a combination of coupling layer 60 and 46 that form an electrical connection between the first coupling layer 59 and active region 33. First coupling layer 59 and first dielectric layer 36 form the gate structure of latch transistor 11.

A detailed description of how to fabricate shared contact structure 30 according to the present invention will now be provided. Along with the description will be the identification of the other elements shown in FIG. 2 and their intended purpose. Shared contact structure 30 can be used in a variety of semiconductor devices, such as memory cells, microprocessors, microcontrollers, and the like. Only the relevant portions of shared contact structure 30 that are necessary to demonstrate how electrical connection can be made among three coupling layers are shown in FIG. 2.

Shared contact structure 30 provides electrical contact to active region 33, which is in a body of semiconductor material or a semiconductor substrate 31. Semiconductor substrate 31 can be made from any material used in the industry, such as silicon. Isolation regions 32 may be optionally formed in semiconductor substrate 31 and are used to provide electrical isolation between neighboring device structures. Isolation regions 32 can be formed using either a localized oxidation process or formed by etching trenches into semiconductor substrate 31 and filling the trenches with a non-conductive material, such as silicon dioxide.

First dielectric layer 36, preferably consisting of silicon dioxide, is formed by oxidizing a surface 34 of semiconductor substrate 31. It should also be understood that first dielectric layer 36 can be formed from a combination of several dielectric materials with each layer made from a different material. For instance, first dielectric layer 36 can be a layer of silicon nitride on a layer of silicon dioxide. First dielectric layer 36 is about 30 angstroms to 3000 angstroms thick and is primarily used to provide electrical isolation between first coupling layer 59 and semiconductor substrate 31. This allows first coupling layer 59 to act as a gate structure to modulate a channel region (not shown) under first dielectric layer 36. In one embodiment, the first coupling layer 59 does not contact the substrate because it is physically separated from the substrate by first dielectric layer 36 and isolation regions 32.

First polysilicon layer 37 is then formed from a single deposition of polysilicon or amorphous silicon onto first dielectric layer 36 to a thickness of about 300 angstroms to 3,000 angstroms. As will be described later in more detail, many of the previously known contact structures deposit the first coupling layer in a two-step deposition process to form a contact opening to the underlying substrate. The present invention obviates this two-step deposition process and eliminates the problems associated with two-step depositions since the present invention can form first polysilicon layer 37 in a single step deposition process.

First conductive layer 38 is then deposited or sputtered onto first polysilicon layer 37. First conductive layer 38 is optional and can be made from a variety of materials, such as tungsten silicide, titanium silicide, and the like.

A cap layer 39 is formed on first conductive layer 38 that is made from a dielectric material, such as silicon nitride, to a thickness of about 500 angstroms to 2,000 angstroms. Cap layer 39 is formed to provide some of the physical isolation between first coupling layer 59 and any overlying conductive layers. A first masking pattern (not shown) is then formed on cap layer 39, and a reactive ion etch (RIE) is used to remove portions of cap layer 39, first conductive layer 38, first polysilicon layer 37, and first dielectric layer 36. After the first masking pattern is removed, a dielectric material, such as silicon nitride, is then deposited and patterned to form sidewall spacers 35. Sidewall spacers 35 are formed from a non-conductive material and are used to provide physical isolation between second coupling layer 60 and first coupling layer 59. The first coupling layer 59 lies along a vertical surface spacer 35, and the second coupling layer lies along an arcuate surface of spacer 35.

A second masking pattern (not shown) is then formed on semiconductor substrate 31 to expose surface 34 where active region 33 is formed. A conventional diffusion or implantation process is then used to dope active region 33 to the desired conductivity and concentration. The second masking layer is removed and a second dielectric layer 41 is then deposited on semiconductor substrate 31 to further provide electrical isolation between first coupling layer 59 and second coupling layer 60. Preferably, second dielectric layer 41 is made from silicon dioxide by a chemical vapor deposition (CVD) process using tetraethylorthosilicate. Second dielectric layer 41 is about 500 angstroms to about 2,000 angstroms thick and again can comprise a sequence of dielectric layers made from different materials.

A third masking pattern (not shown) is then formed on second dielectric layer 41 so that a first opening 40 can be made in second dielectric layer 41 where second polysilicon layer 42 will contact active region 33. An RIE etch is used to remove the exposed portion of second dielectric layer 41 to expose underlying portions of semiconductor substrate 31. After the third masking pattern is removed, second polysilicon layer 42 is formed by depositing a film of polysilicon, amorphous silicon, or the like that is about 100 angstroms to 3,000 angstroms thick. Again, a single deposition process can be used to form second polysilicon layer 42 to eliminate the problems associated with depositing coupling layers in a two-step deposition process. Second conductive layer 43 is then formed on second polysilicon layer 42 to enhance the electrical characteristics of second coupling layer 60. The formation of second conductive layer 43 is optional and, if used, is preferably formed from tungsten silicide or titanium silicide.

A fourth masking pattern (not shown) and an RIE etch process are used to pattern second conductive layer 43 and second polysilicon layer 42 so that the second coupling layer has an edge 65. After the fourth masking pattern is removed, a third dielectric layer 44 is then deposited onto semiconductor substrate 31. Preferably, third dielectric layer 44 is a film of undoped glass that will provide a planar surface 47. Third dielectric layer 44 is about 3,000 angstroms to 10,000 angstroms thick. Usually, the third dielectric layer 44 is typically deposited to a thickness greater than the combined thickness of first and second coupling layers 59 and 60. As seen in FIG. 2, all points along the planar surface 47 lie at elevations higher than the highest point of the second coupling layer 60. Third dielectric layer 44 can also be made from other dielectric materials and can be formed as a sequence of different dielectric layers.

A fifth masking layer (not shown) is then formed on planar surface 47 to expose third dielectric layer 44 where a contact opening 45 will be made. An RIE etch is then used to remove the exposed portions of third dielectric layer 44, second dielectric layer 41, and cap layer 39. A fluorine- or chlorine-based chemistry is used to perform the RIE etch. The chemistry of the RIE etch will produce a similar etch rate for silicon dioxide and silicon nitride material. However, the etch chemistry is selective to the materials used to form second conductive layer 43 and first conductive layer 38. The RIE etch will then remove all the exposed dielectric material in contact opening 45 and expose the top surfaces of second coupling layer 60 and first coupling layer 59.

The exact width of contact opening 45 is about 0.1 microns to 2 microns wide and will depend on the accuracy of the etch and photolithographic equipment used to form contact opening 45. Preferably, contact opening 45 is formed so that it is centered to edge 65 of second coupling layer 60. This will allow an equal portion of second coupling layer 60 and first coupling layer 59 to be exposed. This will ensure that the contact area is evenly distributed so a reliable, electrical contact can be made to both first coupling layer 59 and second coupling layer 60.

FIG. 2 shows a first embodiment for forming shared contact structure 30 where third coupling layer 46 is in direct physical contact with second conductive layer 43 and first conductive layer 38. Therefore, the electrical connection between third coupling layer 46 and second coupling layer 60 and the electrical connection between third coupling layer 46 and first coupling layer 59 are provided by direct physical contact. As shown in FIG. 2, third coupling layer 46 is formed by depositing a layer of polysilicon, amorphous silicon, aluminum, or similar material directly onto planar surface 47 and into contact opening 45. Third coupling layer 46 is about 150 angstroms to 5,000 angstroms thick and provides the physical contact necessary to make electrical contact from third coupling layer 46 to active region 33. Portions of third coupling layer 46 may be selectively patterned and doped to form a load resistor, such as load resistor 24 shown in FIG. 1.

Figure 3:
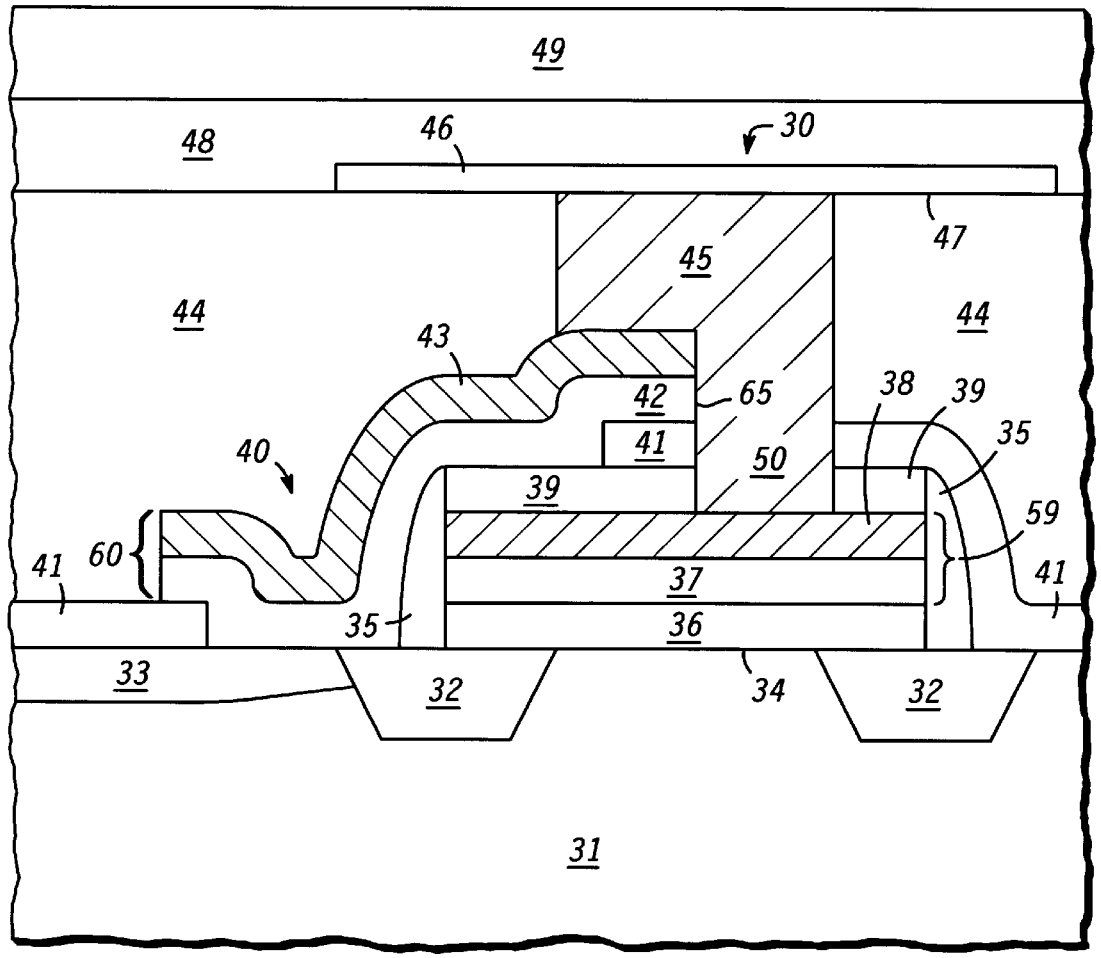
FIG. 3 is an enlarged cross-sectional view showing the shared contact according to a second embodiment of the present invention.

FIG. 3 shows a second embodiment for forming shared contact structure 30 where a plug or a contact 50 is used to provide the electrical contact between third coupling layer 46 and coupling layers 59 and 60. Shared contact structure 30 of FIG. 3 is similar to that shown in FIG. 2 except that third coupling layer 46 does not physically contact second coupling layer 60 or first coupling layer 59. Instead, physical contact is provided by contact 50. Contact 50 can be formed from a variety of conductive materials, such as tungsten, titanium, titanium nitride, titanium silicide, tungsten silicide and polysilicon, and is formed in a sputtering or CVD deposition process. The material used to form contact 50 is planarized with a polishing process and then third coupling layer 46 is formed on planar surface 47 and contact 50. Contact 50 of the second embodiment may be the preferred method of forming shared contact structure 30 if the depth and width of contact opening 45 are not conducive to the direct deposition of third coupling layer 46 as in the first embodiment of FIG. 2. Contact 50 can be considered as part of third coupling layer 46 much like first conductive layer 38 is considered part of first coupling layer 59.

After third coupling layer 46 is formed, an insulating layer 48 and an interconnects (not shown) are formed. The interconnects provide $V_{DD}$, $V_{SS}$, and bit line signals to the memory cell 10. A passivation layer 49 is then deposited over the insulating layer 48 and interconnects. Passivation layer 49 provides environmental protection to the underlying layers and provides a planar surface for the formation of other coupling layers or semiconductor device structures. In the above example, third coupling layer 46 was a layer of polysilicon used to form a load resistor. However, it should also be understood that third coupling layer 46 is not limited to this application. Third coupling layer 46 could also be one of many overlying metal layers used to provide electrical connections within a semiconductor device. Third coupling layer 46 could also be a portion of a thin film transistor (TFT) formed on planar surface 47.

Shared contact structure 30 of the present invention offers many advantages over previously known contact structures. First, the present invention does not require physical contact between the first and second coupling layers. This is accomplished by forming the second coupling layer in a two-step deposition process and inserting an RIE etch process between the depositions. In addition, sidewall spacers must be formed around the contact area between the first and second coupling layer to prevent unintentional electrical shorting to other structures. Such a technique not only adds costly processing steps, but suffers from problems due to an interface that is formed in the second coupling layer as a result of forming the second coupling layer in a two-step deposition process. In contrast, the present invention physically isolates first coupling layer 59 from second coupling layer 60 so the number of process steps is reduced and second coupling layer 60 can be formed in a single deposition process without the risk of forming an interface.

Second, the present invention does not require that first coupling layer 59 be in physical contact with active region 33 or semiconductor substrate 31. Some previously known structures essentially require that the first coupling layer be deposited in a two-step deposition process with an RIE etch between depositions. The problem associated with the RIE etch step is that it is difficult to control the etch since the chemistry will remove both the first coupling layer and the semiconductor substrate at about the same rate. The RIE etch will also expose the first dielectric layer, which is usually the gate dielectric material, to the charged plasma of the etch. This exposure could damage the first dielectric layer due to charging effects of the plasma.

A third advantage of the present invention is that shared contact structure 30 requires less space to accomplish the electrical connection from third coupling layer 46 to active region 33. As shown in FIG. 2 and FIG. 3, a single contact opening 45 is used to provide contact between third coupling layer 46 and coupling layers 59 and 60. Therefore, shared contact structure 30 can be used in semiconductor devices to provide the necessary electrical contact and do so within less area than some previously known contact structures. This allows the semiconductor device to be formed in a smaller area, which in turn reduces the manufacturing cost of the semiconductor device.

By now it should be appreciated that the present invention provides a shared contact structure and a method of making the shared contact structure. The shared contact structure provides the necessary electrical connection among three coupling layers and connects the coupling layers to an active region in a semiconductor substrate. The shared contact structure can be formed using fewer processing steps and requires less surface area than some previously known contact structures. Therefore, the shared contact structure will reduce the manufacturing costs of a semiconductor device employing the features of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A method for forming a semiconductor device having a shared contact, the method comprising the steps of:

providing a semiconductor substrate having a surface and an active region;

forming a first dielectric layer overlying the surface of the semiconductor substrate;

forming a first coupling layer on the first dielectric layer, wherein the first coupling layer is separated from the semiconductor substrate;

forming a second dielectric layer on the first coupling layer;

forming a first opening in the second dielectric layer to expose a portion of the active region in the semiconductor substrate;

forming a second coupling layer on the second dielectric layer and in the first opening, the second coupling layer being physically isolated from the first coupling layer and in physical contact with the active region of the semiconductor substrate;

forming a third dielectric layer overlying the second coupling layer;

forming a first opening in the third dielectric layer to provide an exposed portion of the second coupling layer and an exposed portion of the first coupling layer; and forming a third coupling layer on the third dielectric layer so that the third coupling layer is in electrical contact with the exposed portion of the second coupling layer and the exposed portion of the first coupling layer.

2. The method of claim 1, further comprising the step of forming a plug in the first opening in the third dielectric layer, the plug being in contact with the first coupling layer and the second coupling layer.

3. The method of claim 1, wherein the step of forming the third coupling layer includes forming the third coupling layer in the first opening in the third dielectric layer so that the third coupling layer is in physical contact with the exposed portion of the first coupling layer and the exposed portion of the second coupling layer.

4. The method of claim 1, wherein the step of forming the first opening in the third dielectric layer forms the first opening with a width of about 0.1 microns to 2 microns.

5. The method of claim 1, wherein the step of forming the third coupling layer forms the third coupling layer to a thickness no thicker than 1,000 angstroms.

6. The method of claim 1, wherein the step of forming the first coupling layer includes the step of forming a conductive layer on the first coupling layer, the conductive layer made from a material selected from the group consisting of polysilicon, tungsten silicide, and titanium silicide.

7. The method of claim 1, wherein the step of forming the first coupling layer forms the first coupling layer in a single step deposition process.

8. The method of claim 1, wherein the step of forming the second coupling layer forms the second coupling layer in a single step deposition process.

9. The method of claim 1, further comprising a step of forming a spacer having a first surface and a second surface between the steps of forming the first coupling layer and forming the second coupling layer, wherein:

the step of forming the spacer is performed such that the first coupling layer physically contacts the first side of the spacer; and the step of forming the second coupling layer is performed such that the second coupling layer physically contacts the second side of the spacer.

* * * * *